US010479169B2

(12) United States Patent
De Souza

(10) Patent No.: US 10,479,169 B2
(45) Date of Patent: Nov. 19, 2019

(54) CONTROL MODULE FOR AN ELECTRIC APPLIANCE

(71) Applicant: Valeo Systemes Thermiques, Le Mesnil-Saint-Denis (FR)

(72) Inventor: Stéphane De Souza, Les Essarts-le-Roi (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 1093 days.

(21) Appl. No.: 14/778,632

(22) PCT Filed: Mar. 20, 2014

(86) PCT No.: PCT/EP2014/055654
§ 371 (c)(1),
(2) Date: Sep. 21, 2015

(87) PCT Pub. No.: WO2014/154567
PCT Pub. Date: Oct. 2, 2014

(65) Prior Publication Data
US 2016/0039266 A1 Feb. 11, 2016

(30) Foreign Application Priority Data

Mar. 26, 2013 (FR) ...................................... 13 52728

(51) Int. Cl.
*B60H 1/22* (2006.01)
*F24H 3/04* (2006.01)
(Continued)

(52) U.S. Cl.
CPC ............ *B60H 1/2218* (2013.01); *B23P 19/04* (2013.01); *F24H 3/0429* (2013.01);
(Continued)

(58) Field of Classification Search
CPC .. H05K 1/00; H05K 7/20; H05K 7/02; H05K 7/06; H05K 7/08; H05K 7/10; B60H 1/22; B60H 1/2218
(Continued)

(56) References Cited

U.S. PATENT DOCUMENTS 5,398,160 A * 3/1995 Umeda ................. H01L 23/057
257/711
6,147,869 A * 11/2000 Furnival .............. H05K 7/1432
165/185
(Continued)

FOREIGN PATENT DOCUMENTS

DE  10 2006 009 812 B4  9/2008
EP     2 330 865 A1      6/2011
FR     2 954 606 A1      6/2011

OTHER PUBLICATIONS

International Search Report issued in corresponding application No. PCT/EP2014/055654 dated Jun. 24, 2014 (3 pages).

*Primary Examiner* — Tuan T Dinh
(74) *Attorney, Agent, or Firm* — Osha Liang LLP

(57) ABSTRACT

The invention relates to a control module (4) for an electric appliance (3), comprising: a printed circuit board (11), on which electrical and electronic components (12) are mounted; and an electronic power component (10) separated from the printed circuit board (11) and held in relation thereto by means of at least one electrical connection body (18a, 18b, 18c) fixed to the printed circuit board (11) and connected to one (D) of the terminals (S, D, G) of the electronic power component (10).

8 Claims, 4 Drawing Sheets

Figure 1:
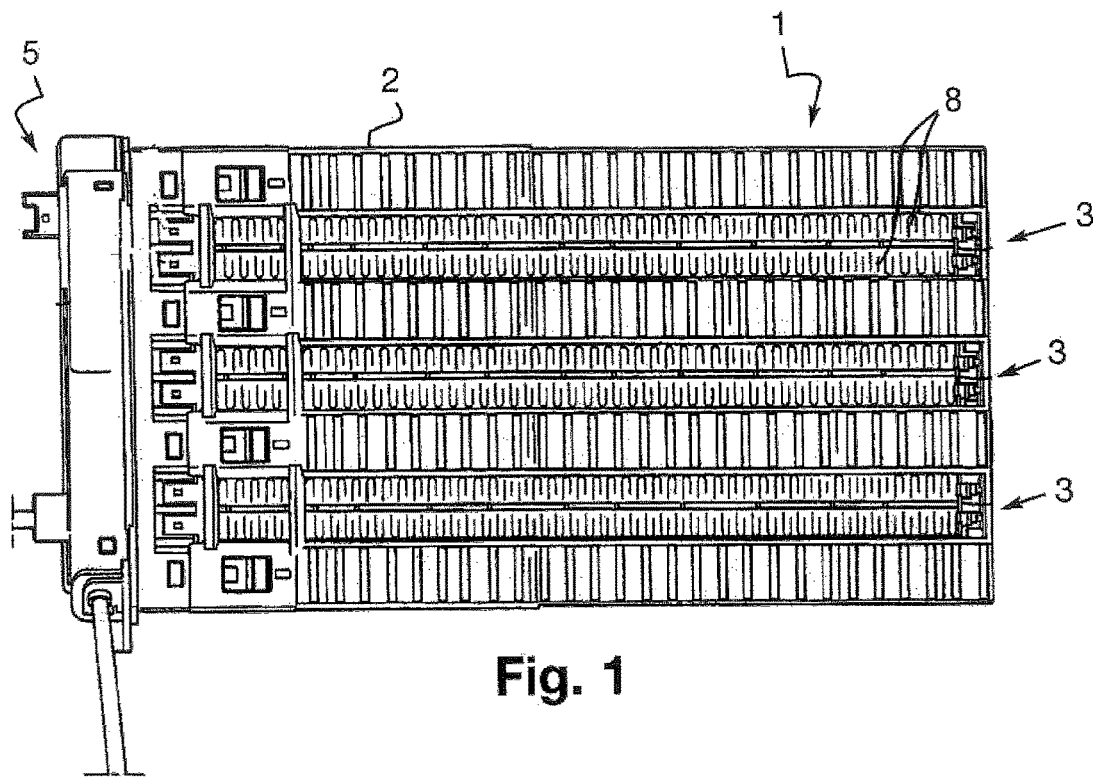

(51) Int. Cl.
  *F24H 9/20* (2006.01)
  *H05K 1/02* (2006.01)
  *B23P 19/04* (2006.01)
  *H05K 1/18* (2006.01)

(52) U.S. Cl.
  CPC ......... *F24H 3/0441* (2013.01); *F24H 9/2071* (2013.01); *H05K 1/0201* (2013.01); *H05K 1/184* (2013.01); *H05K 2201/062* (2013.01); *H05K 2201/09063* (2013.01); *H05K 2201/1031* (2013.01); *H05K 2201/10166* (2013.01); *H05K 2201/10272* (2013.01); *H05K 2201/10424* (2013.01); *Y02P 70/611* (2015.11)

(58) Field of Classification Search
  USPC ................ 361/707–712, 782–784, 803, 813; 439/76.2
  See application file for complete search history.

(56) References Cited

U.S. PATENT DOCUMENTS

| | | | |
|---|---|---|---|
| 6,320,748 B1 | 11/2001 | Roden et al. | |
| 6,441,520 B1* | 8/2002 | Grant | H01L 25/16 174/252 |
| 6,912,134 B2* | 6/2005 | Grant | H05K 7/20209 257/666 |
| 6,977,430 B2* | 12/2005 | Nowak | H01L 25/18 257/690 |
| 7,046,518 B2* | 5/2006 | Golightly | H05K 7/1432 257/706 |
| 8,957,697 B2* | 2/2015 | Ueda | H05K 1/0268 324/750.01 |
| 2005/0139055 A1 | 6/2005 | Higuchi et al. | |
| 2008/0119065 A1 | 5/2008 | Takakusaki et al. | |
| 2009/0127685 A1* | 5/2009 | Jong | H01L 23/4334 257/676 |
| 2010/0182010 A1 | 7/2010 | Granzer et al. | |
| 2011/0096496 A1* | 4/2011 | Doo | H01F 27/025 361/689 |

* cited by examiner

CONTROL MODULE FOR AN ELECTRIC APPLIANCE

The present invention relates to a control module for an electric appliance, and a heating device, notably for a motor vehicle, comprising such a control module, and a method for manufacturing such a module.

The invention applies notably to the technical field of add-on electric heating devices. Such heating devices are notably used in the first minutes of starting of a motor vehicle, when the engine is not hot enough to ensure the supply of hot air into the vehicle interior. This warm-up time is, for example, between 15 and 20 minutes for a diesel-type engine.

Such an add-on heating device generally comprises a support frame on which are mounted parallel heating modules arranged so as to be passed through by a flow of air to be heated.

Each heating module comprises two electrodes between which are placed resistive elements of positive temperature coefficient type. Two opposing heat sinks are fixed onto the electrodes, so as to increase the surface area of exchange with the flow of air to be heated. The heat sinks are, for example, formed by pleated or corrugated metal strips.

Each heating module thus comprises a positive terminal linked electrically to the positive terminal of a battery, and a negative terminal linked electrically to the negative terminal of the battery via a power transistor, such as a field-effect transistor with metal-oxide gate, also called MOSFET.

More particularly, each MOSFET is soldered onto a printed circuit board of a control module, also called "driver". The control module is mounted in a casing fixed to the support frame.

Each MOSFET comprises a first terminal called drain and linked to the negative terminal of the corresponding heating module, a second terminal called source and linked to the negative terminal or ground of the battery, and a third terminal called gate serving as input for a control signal making it possible to control the opening and the closing of the MOSFET.

The different electrical links can notably be provided by conductor bars linked mechanically together by an electrically insulating fitting fixed onto the printed circuit board.

Such a heating device is notably known from the document FR 2 954 606 in the name of the Applicant.

When a MOSFET is open, no current flows through the corresponding resistive elements. Conversely, when the MOSFET is closed, a current passes into the resistive elements so as to provide the heating of the electrodes and of the heat sinks.

When a MOSFET is closed, that is to say when it is in the on state, it has a not inconsiderable resistance Rdson. Since the current passing into the MOSFET and the resistive elements is relatively great, a not inconsiderable quantity of heat (2 to 3 watts) is dissipated by the MOSFET, in normal operation.

There is also a very low risk of the MOSFET being damaged and then being in a short-circuit state. In this case, the quantity of heat dissipated is greater, for example of the order of 20 to 30 watts.

In both case, it is advisable to ensure that the heat thus produced by each MOSFET does not damage the other electronic components of the printed circuit board.

For that, it is known practice to place a part of the conductor bars linking the MOSFETs to the negative terminals of the heating modules in the flow of air, so that a portion of the heat dissipated by the MOSFET is discharged via this flow of air.

It is also known practice to provide generally U-shaped slits partially surrounding the MOSFETs so as to limit the conduction of heat toward the other electronic components of the printed circuit board. These slits do not however sufficiently reduce these conduction phenomena and there remain risks of degradation of the surrounding electronic components, notably when seeking to power high-power heating modules or when at least one of the MOSFETs is damaged. In fact, the heat can still be conducted via bridges of material situated between the parts of the printed circuit board supporting the MOSFETs and the rest of the printed circuit board.

The aim of the invention is notably to provide a simple, effective and economical solution to this problem.

To this end, the invention proposes a control module for an electric appliance comprising a printed circuit board, on which are mounted electrical and electronic components, and at least one power electronic component, characterized in that the power electronic component is separate from the printed circuit board and is held relative thereto using at least one electrical link member fixed onto the printed circuit board and linked to one of the terminals of the power electronic component.

With the power electronic component being separate or remote from the printed circuit board, any transmission of heat by conduction to the other electronic components is avoided. Any risk of degradation of these electronic components is consequently avoided. Moreover, the fact that the power electronic component is attached mechanically to the printed circuit board via the electrical link member makes it possible to form a unitary assembly which can be handled and mounted easily inside a casing for example.

According to a feature of the invention, the power electronic component is a power transistor, for example a field-effect transistor with metal-oxide gate.

Such a transistor is generally passed through by a high current, and therefore generates heat which is a function notably of its resistance in the on state. By comparison with the prior art, the invention makes it possible to use transistors of MOSFET type that have a higher resistance in the on state Rdson and are therefore less costly, and/or transistors passed through by very high currents.

A first link member can be linked electrically to a first terminal of the power electronic component, a second link member being linked electrically to a second terminal of the power electronic component, the two link members being linked mechanically to one another via an electrically insulating fitting, said support fitting being fixed onto the printed circuit board.

Furthermore, the power electronic component can be mounted on a substrate extending substantially in the plane of the printed circuit board, the latter being separated from said substrate by a slit.

In this case, said slit is U-shaped and emerges by its ends on a peripheral edge of the printed circuit board.

Such a slit can be produced easily by machining, notably by milling.

The invention relates also to a heating device, notably for a motor vehicle, comprising a control module of the above-mentioned type, at least one heating module comprising a first terminal linked electrically to a first terminal of a battery, a second terminal linked electrically to the first terminal of the power electronic component, via the first electrical link member, a second terminal of the battery being linked electrically to the second terminal of the power electronic component, via the second electrical link member.

The first terminal of the heating module can be linked electrically to the first terminal of the battery via a third electrical link member, the three link members being linked mechanically to one another via an electrically insulating fitting fixed onto the printed circuit board.

The link members are, for example, conductor bars.

The invention relates finally to a method for manufacturing a control module of the abovementioned type, comprising the steps of:
mounting a set of electronic components, including at least one power electronic component, on at least one printed circuit board linked to a panel via at least one bridge of material,
electrically linking at least one link member to a terminal of the power electronic component and fixedly mounting said link member on the printed circuit board,
machining the printed circuit board so as to separate the part supporting said power electronic component from the rest of the printed circuit board, the power electronic component being held by the electrical link member, and separating the printed circuit board from the rest of the panel by machining the bridge of material.

By comparison with the prior art, the method according to the invention proposes machining the printed circuit board so as to completely separate the part supporting the power electronic component from the rest of the printed circuit board. This machining can be done at the same time as the machining of the bridge of material in order to separate the printed circuit board from the rest of the panel.

Prior to the mounting of the electronic components, the panel can comprise slits delimiting the printed circuit board and the bridge of material, and at least one slit partially surrounding the power electronic component to be insulated from the rest of the electronic board.

In this case, the slit partially surrounding the power electronic component can be prolonged by machining so as to completely separate the part supporting the power electronic component from the rest of the printed circuit board.

Furthermore, the panel can comprise a number of distinct printed circuit boards, each linked by at least one bridge of material to the panel.

Figure 2:
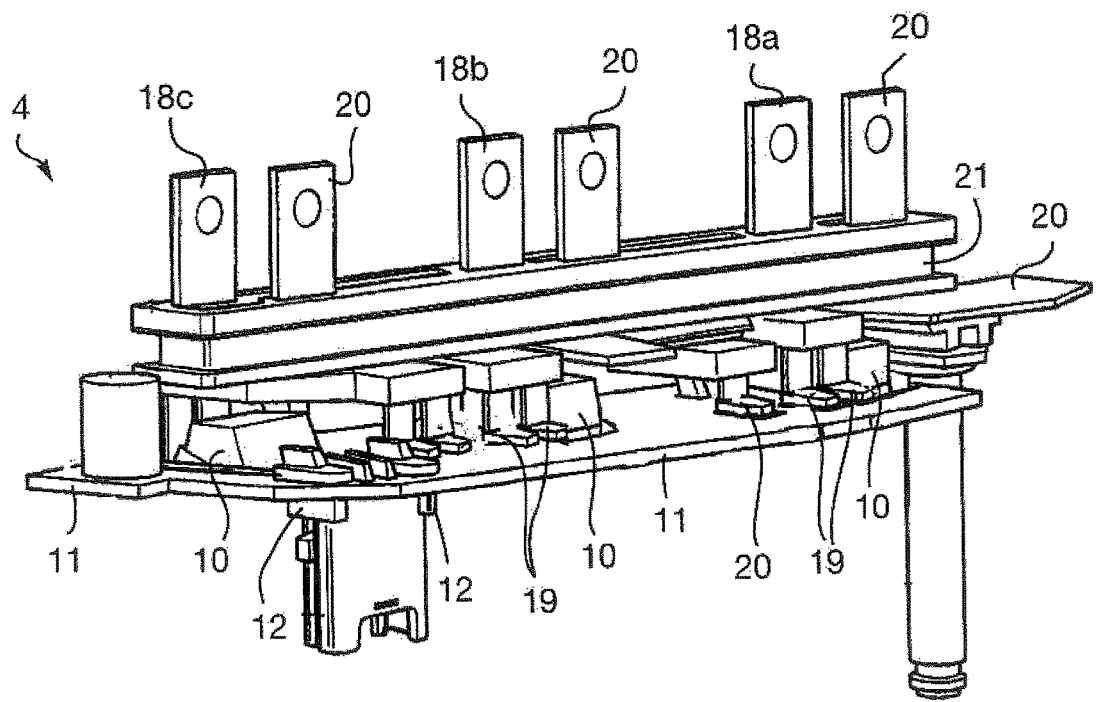
Figure 3:
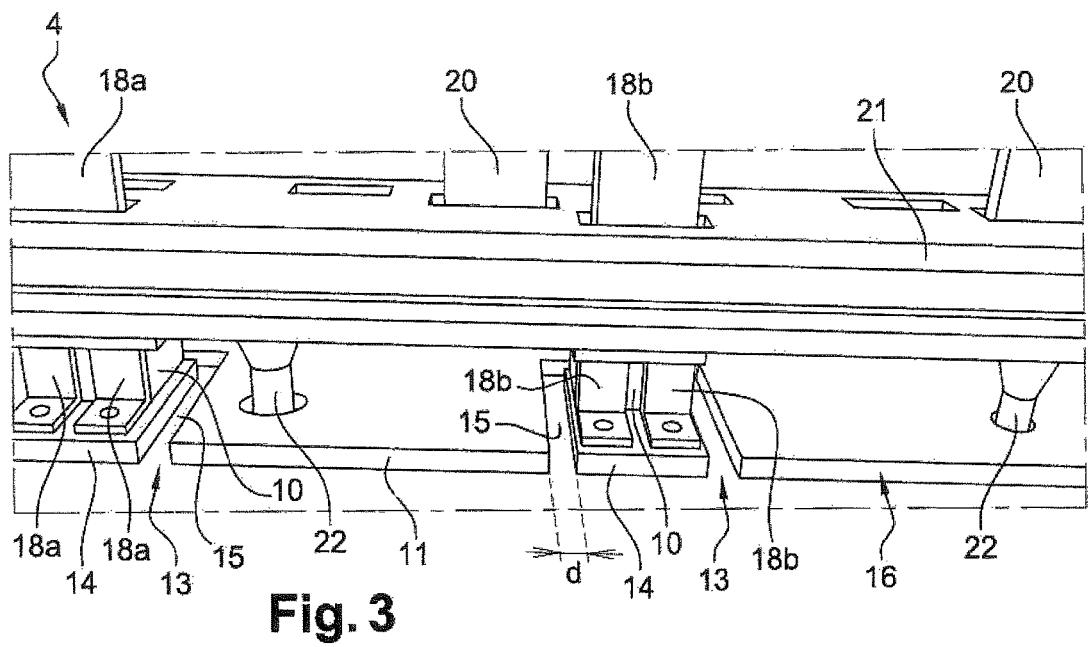
Figure 4:
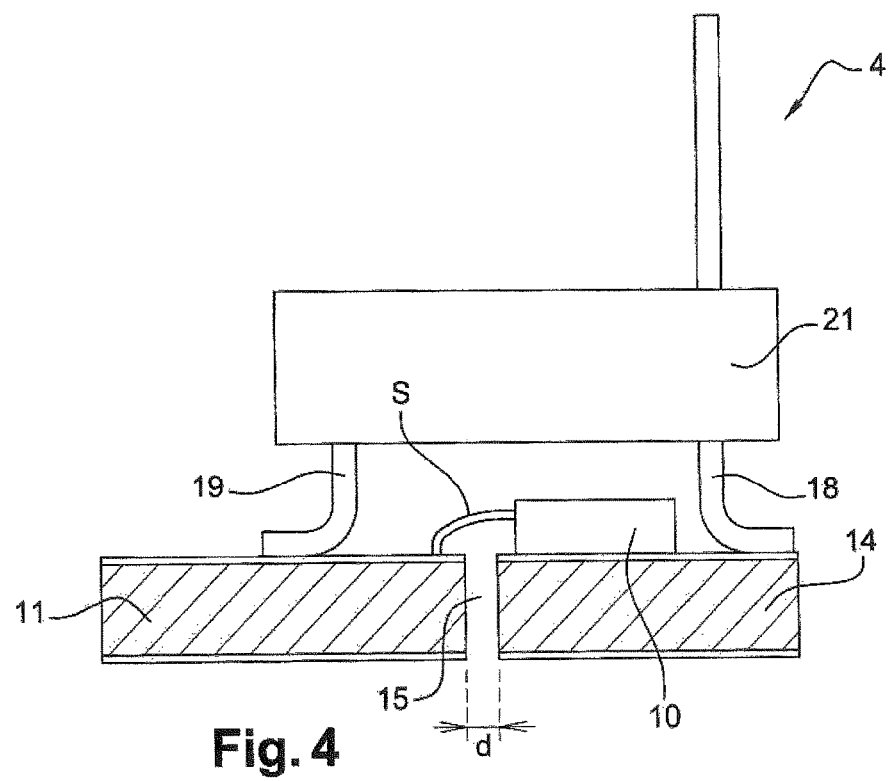
Figure 5:
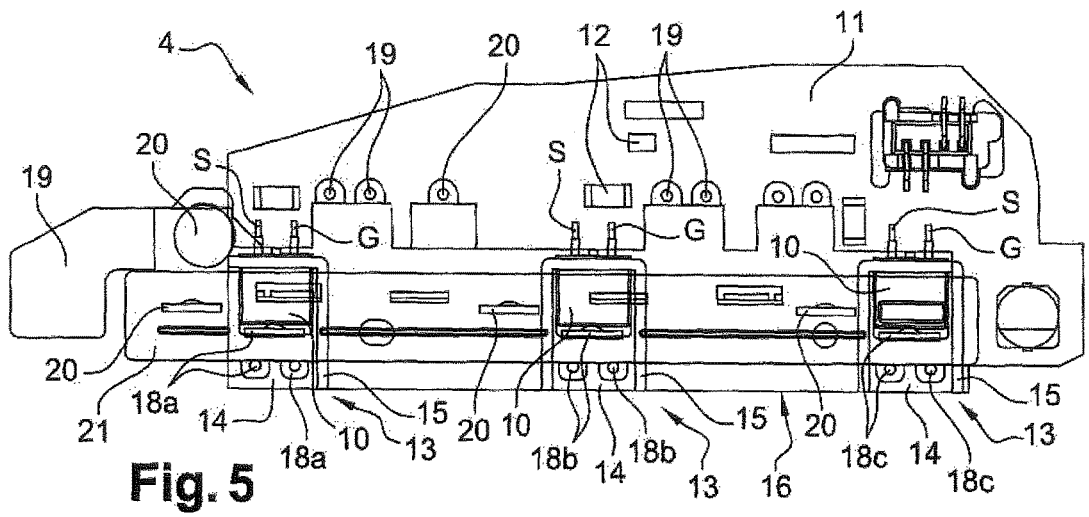
Figure 6:
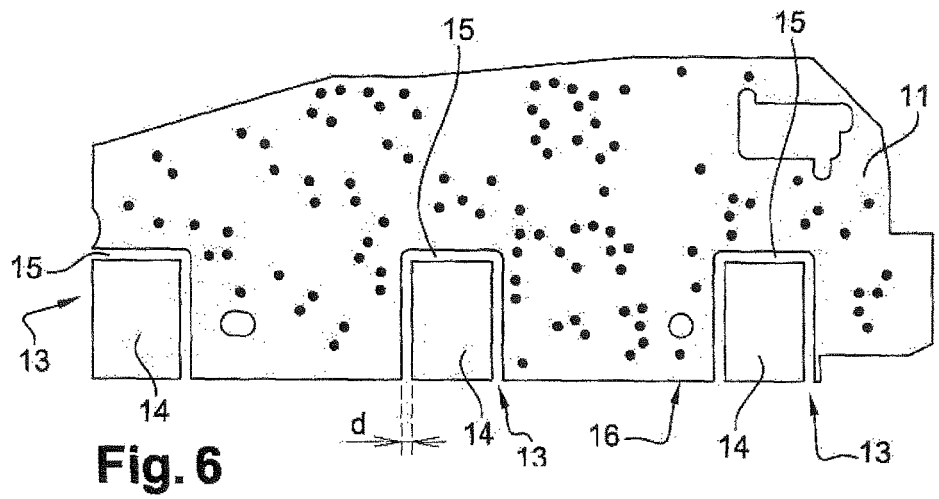
Figure 7:
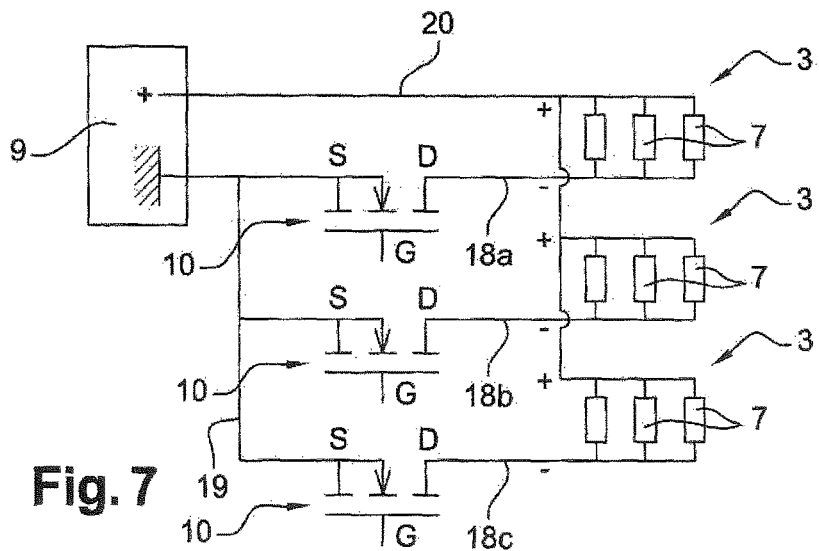
Figure 8:
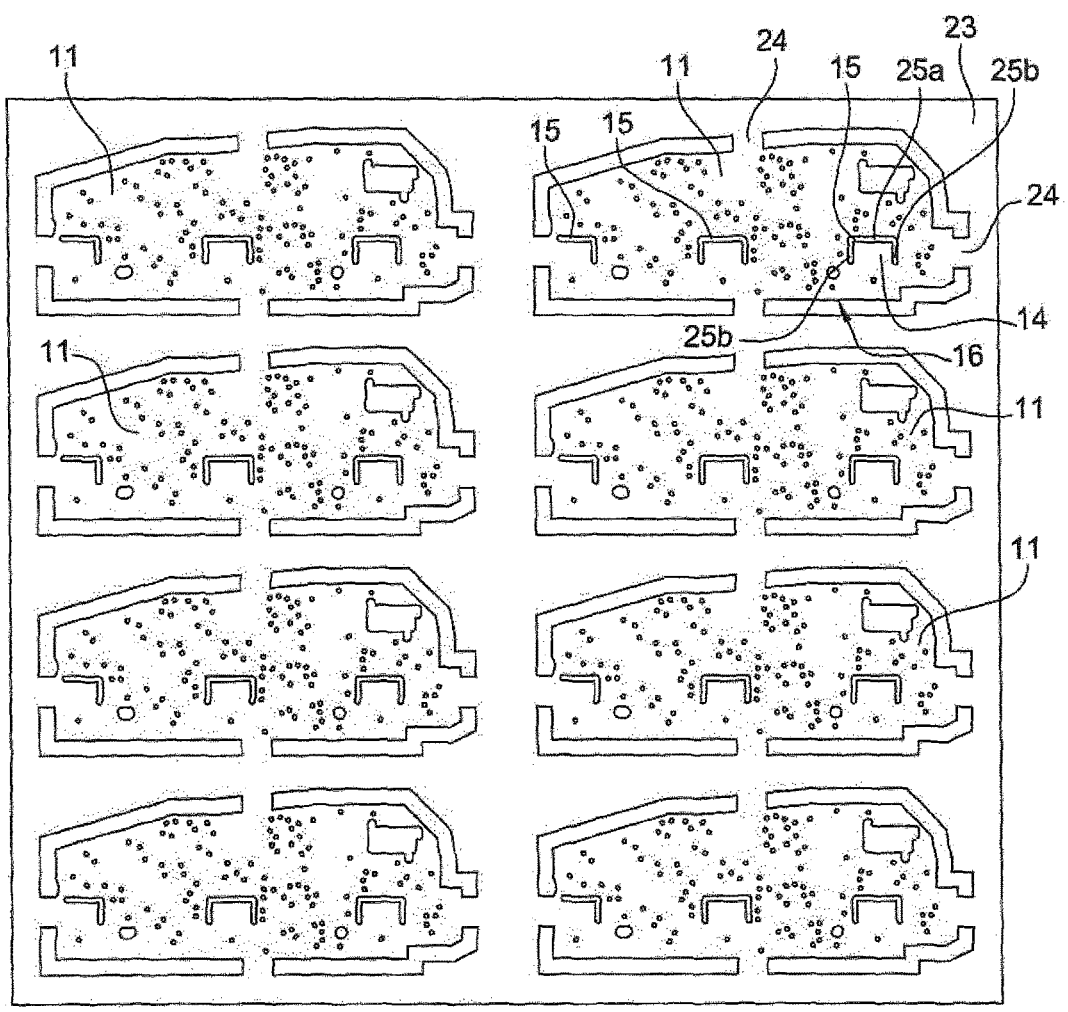
Figure 9:
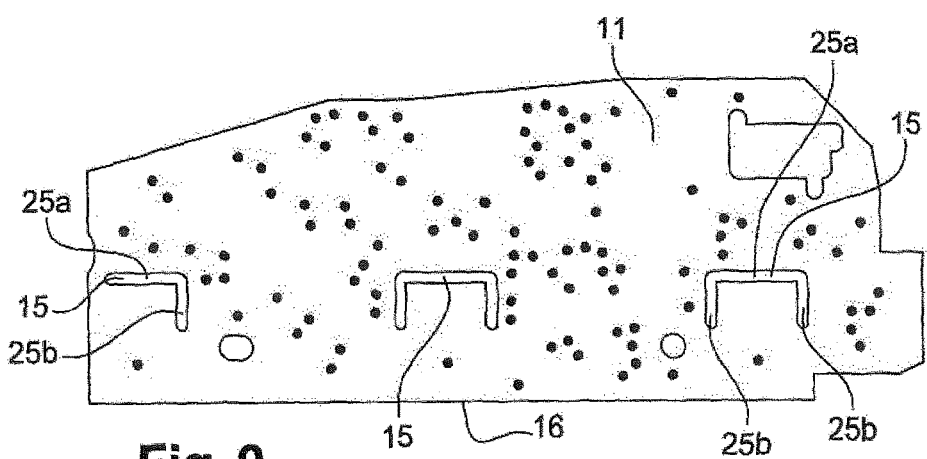

The invention will be better understood and other details, features and advantages of the invention will become apparent on reading the following description given by way of non-limiting example with reference to the attached drawings in which:

FIG. 1 is a front view of a heating device according to the invention,

FIG. 2 is a perspective view, from the front, of a control module according to the invention, belonging to the heating device of FIG. 1, FIG. 3 is a perspective view, from the rear, of a part of the control module of FIG. 2, FIG. 4 is a schematic view in transverse cross section of a part of the control module of FIGS. 2 and 3, FIG. 5 is a plan view of the abovementioned control module, FIG. 6 is a plan view of a printed circuit board and of the substrates of the MOSFETs belonging to the control module according to the invention, FIG. 7 is a schematic view of the power electrical wiring of the heating device, FIG. 8 is a plan view of a panel used to produce the printed circuit boards, FIG. 9 is a view of a part of the panel of FIG. 8.

FIG. 1 represents an add-on electric heating device 1 according to the invention, intended to equip a motor vehicle. Such a heating device 1 is notably used in the first minutes of use of the motor vehicle, when the engine is not hot enough to ensure the supply of hot air into the vehicle interior.

This device 1 comprises a parallelepipedal support frame 2 on which are mounted parallel heating modules 3 arranged so as to be passed through by a flow of air to be heated. The heating modules 3 are controlled using a control module 4 (FIGS. 2 and 5), or driver, mounted in a casing 5 fixed to the support frame 2.

Each heating module 3 comprises two electrodes or terminals referenced + and − in FIG. 7, between which are placed resistive elements 6 (FIG. 7) of positive temperature coefficient (PTC) type. Two opposing heat sinks 8 are fixed onto the electrodes, so as to increase the surface area of exchange with the flow of air to be heated. The heat sinks 8 are, for example, formed from pleated or corrugated metal strips.

Each heating module 3 thus comprises a positive terminal linked electrically to the positive terminal of a battery 9, and a negative terminal linked electrically to the negative terminal of the battery 9 via a power transistor, such as a field-effect transistor with metal-oxide gate 10, also called MOSFET.

The control module 4 comprises a printed circuit board on which are soldered or mounted different electrical and electronic components 12 and comprise rectangular or square cut-outs 13 making it possible to house substrates 14 onto which the MOSFETS are soldered. Each substrate 14 has a form corresponding to that of the cut-outs 13. The edge of each substrate 14 is separated from the printed circuit board 11 by a distance d of between 1 and 2 mm. The slit 15 extending between the printed circuit board 11 and the edge of each substrate 14 is of general U-shape and comprises two legs emerging at the peripheral edge 16 of the printed circuit board. Each substrate 14 extends in the plane of the printed circuit board 11 and has a thickness substantially equal to the thickness of said printed circuit board 11. As can be better seen in FIG. 7, each MOSFET 10 comprises a first terminal called drain D, forming the base of the MOSFET, and which is linked to the negative terminal of the corresponding heating module 3, a second terminal called source S and linked to the negative or ground terminal of the battery 9, and a third terminal called gate G, serving as input for a control signal making it possible to control the opening and the closing of the MOSFET 10.

Each substrate 14 comprises at least one track of conductive material, for example of copper, making it possible to solder thereon the base of the MOSFET 10, that is to say the drain D, and terminations of a conductor bar 18a, 18b, 18c described hereinbelow.

Each MOSFET 10 further comprises two tabs of small cross section, one of which is linked to the source S and the other of which is linked to the gate G. Said tabs S, G are soldered onto the printed circuit board (FIG. 5). More particularly, the tab G linked to the gate makes it possible to receive the setpoint signal intended to control the opening or the closing of the MOSFET 10 and the tab S is linked to the negative terminal of the battery 9, via a conductor bar 19 better described below.

The electrical links between the MOSFETs 10, the heating modules 3 and the battery 9 are provided by conductor bars. More particularly, three conductor bars 18a, 18b, 18c respectively link the negative terminal of each heating module 3 to the drain D of the corresponding MOSFET 10. Another conductor bar 19 links all the sources S of the MOSFETs to the negative or ground terminal of the battery 9. A last conductor bar 20 links the positive terminal of the battery 9 to the positive terminals of the different heating modules 3.

The different conductor bars 18a, 18b, 18c, 19, 20 are linked mechanically to one another and electrically insulated from one another by a fitting 21 overmolded with synthetic material and acting as support so that said conductor bars 18a, 18b, 18c, 19, 20 and the fitting 21 form a unitary assembly. The fitting 21 is fixed at 22 onto the printed circuit board (FIG. 3). Moreover, the bars 19 and 20 are fixed, by some of their terminations, onto the printed circuit board (see FIG. 5).

When a MOSFET 10 is open, no current flows the corresponding resistive elements 7. Conversely, when the MOSFET 10 is closed, a current flows in the resistive elements 7 and thus causes the temperature of the corresponding heating module 3 to rise.

Each MOSFET 10 can be opened and closed cyclically, the temperature reached by each heating module 3 then being a function of the opening and closure times of the MOSFET 10.

The separation of the substrate 14 and of the printed circuit board 11 by the slit 15 makes it possible to avoid any conduction of heat, in particular in the case where the MOSFETs are damaged (generally in a state of short circuit between the drain D and the source S) or in the case where the MOSFETs 10 are closed, that is to say when they are in the on state.

It is therefore possible to use MOSFETs 10 that have high resistances Rdson, these being less costly than the MOSFETs that have low resistances Rdson used in the prior art. It is also possible to use high-power heating modules 3 in which a high current flows in the MOSFETs 10.

A control module 4 according to the invention is manufactured by executing the following method.

This method uses a panel 23 (FIG. 8) comprising a plurality of distinct printed circuit boards 11, for example 8 or 16 of them, each printed circuit board 11 being linked to the rest of the panel 23 by bridges of material 24.

As can be better seen in FIG. 9, each board includes U- and/or L-shaped slits 15 surrounding areas 14 intended to accommodate MOSFETS. Each slit 15 comprises a base 25a parallel to the adjacent peripheral edge 16 of the printed circuit board and one or two branches 25b at right angles to the base 25a and parallel to one another. The branches 25b do not emerge at the peripheral edge 16 of the printed circuit board 11.

Electrical components 12 are then mounted on one and/or the other face of the printed circuit board 11, for example by soldering or by brazing. They can notably be SMC components, that is to say surface-mount components. MOSFETs 10 are also mounted in the areas 14 delimited by the slits 15.

The assembly formed by the different conductor bars 18a, 18b, 18c, 19, 20 and by the fitting 21 is then mounted on the printed circuit board 11.

The various bridges of material 24 are then eliminated by milling, so as to detach each printed circuit board from the rest of the panel 23. During this operation, the branches 25b of the slits 15 are also prolonged by machining, for example by milling, so that said branches 25b emerge on the adjacent peripheral edge 16 of the printed circuit board 11.

A control module 4 as described previously is then obtained, comprising a printed circuit board 11 and MOSFETs 10 mounted on substrates 14 separate from the printed circuit board 11 and linked thereto by the conductor bars 18a, 18b, 18c, 19, 20 and by the fitting 21.

Such a method is easy to implement and requires adaptations, relative to the known techniques, which are easy to implement.

The invention claimed is:

1. A control module for an electric appliance comprising:
    a printed circuit board, on which are mounted electrical and electronic components, and
    at least one power electronic component,
    wherein the power electronic component is separate from the printed circuit board and is held relative thereto using at least one electrical link member fixed onto the printed circuit board and linked to one of the terminals of the power electronic component,
    wherein the power electronic component is mounted on a substrate extending substantially in the plane of the printed circuit board, the latter being separated from said substrate by a slit, and
    wherein a first electrical link member is linked electrically to a first terminal of the power electronic component, a second link member being linked electrically to a second terminal of the power electronic component, the first link member and the second linked member being linked mechanically to one another via an electrically insulating fitting, said fitting being fixed onto the printed circuit board.

2. The control module as claimed in claim 1, wherein the power electronic component is a power transistor.

3. The control module as claimed in claim 1, wherein the slit is U-shaped and ends of the slit emerge on a peripheral edge of the printed circuit board.

4. A heating device for a motor vehicle, comprising:
    a control module comprising
        a printed circuit board, on which are mounted electrical and electronic components, and
        at least one power electronic component,
        wherein the power electronic component is separate from the printed circuit board and is held relative thereto using at least one electrical link member fixed onto the printed circuit board and linked to one of the terminals of the power electronic component;
    at least one heating module comprising a first terminal linked electrically to a first terminal of a battery and a second terminal linked electrically to the first terminal of the power electronic component, via the first electrical link member,
    a second terminal of the battery being linked electrically to the second terminal of the power electronic component, via the second electrical link member.

5. The heating device as claimed in claim 4, wherein the first terminal of the heating module is linked electrically to the first terminal of the battery via a third electrical link member, the three link members being linked mechanically to one another via an electrically insulating fitting fixed onto the printed circuit board.

6. A method for manufacturing a control module, comprising the steps of:
    mounting a set of electrical and electronic components, including at least one power electronic component, on at least one printed circuit board linked to a panel via at least one bridge of material,
        wherein the control module comprises the at least one power electronic component including the at least one power electronic component, and the at least one printed circuit board, wherein the at least one power electronic component is separate from the printed circuit board and is held relative thereto using at least one electrical link member fixed onto the printed circuit board and linked to one of the terminals of the at least one power electronic component;

electrically linking at least one link member to a terminal of the at least one power electronic component and fixedly mounting said link member on the printed circuit board; and machining the printed circuit board so as to separate the part supporting the at least one power electronic component from the rest of the printed circuit board, the at least one power electronic component being held by the electrical link member, and separating the printed circuit board from the rest of the panel by machining the bridge of material.

7. The method as claimed in claim 6, wherein, prior to the mounting of the electronic components, the panel comprises slits delimiting the printed circuit board and the bridge of material, and at least one slit partially surrounding the at least one power electronic component to be insulated from the rest of the electronic board.

8. The method as claimed in claim 6, wherein the panel comprises a number of distinct printed circuit boards, each linked by at least one bridge of material to the panel.

* * * * *